US009679622B2

(12) United States Patent
Wang et al.

(10) Patent No.: US 9,679,622 B2
(45) Date of Patent: Jun. 13, 2017

(54) METHOD FOR CONTROLLING MEMORY DEVICE ASYNCHRONOUSLY WITH RESPECT TO SYSTEM CLOCK, AND RELATED MEMORY DEVICE AND MEMORY SYSTEM

(71) Applicant: Piecemakers Technology, Inc., Hsinchu (TW)

(72) Inventors: Gyh-Bin Wang, Hsinchu County (TW); Tah-Kang Joseph Ting, Taipei (TW); Yung-Ching Hsieh, Hsinchu County (TW)

(73) Assignee: Piecemakers Technology, Inc., Hsinchu (TW)

( * ) Notice: Subject to any disclaimer, the term of this patent is extended or adjusted under 35 U.S.C. 154(b) by 226 days.

(21) Appl. No.: 14/676,795

(22) Filed: Apr. 1, 2015

(65) Prior Publication Data

US 2015/0287445 A1  Oct. 8, 2015

(30) Foreign Application Priority Data

Apr. 2, 2014  (TW) .............................. 103112354 A
Mar. 11, 2015  (TW) .............................. 104107758 A (51) Int. Cl.
*G06F 12/00* (2006.01)
*G11C 7/10* (2006.01)
*G06F 3/06* (2006.01)

(52) U.S. Cl.
CPC .......... *G11C 7/1072* (2013.01); *G06F 3/0625* (2013.01); *G06F 3/0658* (2013.01); *G06F 3/0673* (2013.01); *G11C 7/1006* (2013.01); *G11C 7/1066* (2013.01)

(58) Field of Classification Search
USPC ...................................................... 711/170
See application file for complete search history.

(56) References Cited

U.S. PATENT DOCUMENTS

| 6,788,588 | B2 | 9/2004 | Nagai |
| 7,583,541 | B2 | 9/2009 | Miyatake |
| 7,586,794 | B2 | 9/2009 | Lee |
| 8,493,811 | B2 | 7/2013 | Shiu |

*Primary Examiner* — Matthew Bradley
(74) *Attorney, Agent, or Firm* — Winston Hsu (57) ABSTRACT

A control method of a memory device, a memory device and a memory system are provided. The memory system includes a memory control unit and a memory die. The memory die performs a data access operation asynchronously with respect to a system clock according to address information and an access signal generated from the memory control unit. When operating in a read mode, the memory die generates a data tracking signal according to a memory internal read time which is an elapsed time for data to be read to be read out from the memory die. The memory control unit and the memory die obtain required data according to respective data tracking signals transmitted therebetween. The control method defines an asynchronous memory interface protocol which realizes reliable and high speed data transmission.

23 Claims, 8 Drawing Sheets

METHOD FOR CONTROLLING MEMORY DEVICE ASYNCHRONOUSLY WITH RESPECT TO SYSTEM CLOCK, AND RELATED MEMORY DEVICE AND MEMORY SYSTEM

BACKGROUND OF THE INVENTION

1. Field of the Invention

The disclosed embodiments of the present invention relate to an interface protocol of a memory device, and more particularly, to an asynchronous control method of a memory device, and a related memory device and a memory system.

2. Description of the Prior Art

A nowadays high performance integrated circuit (IC) utilizes a synchronous operation to achieve a high data access frequency. A synchronous memory operates with a latency which is a predetermined number of clock cycles between the application of a read/write address and the access of corresponding data, wherein the application of other read/write address(es) is allowed before the access of the corresponding data is completed. This increases the data access frequency. In contrast, data access of an asynchronous memory is defined by the application of a read/write address and the access of data, wherein a next read/write address is not applied until the current data access is completed. In other words, the asynchronous memory cannot have a high data access frequency. However, peripheral circuitry of a conventional high performance memory has a large size, causing side effects such as a great increase in area/cost of a memory die, and high power consumption.

Thus, there is a need for a novel memory architecture and a transmission interface protocol. Hence, optimization of bandwidth and power consumption can be considered from a memory system viewpoint, and an overall cost of a memory system can be reduced accordingly.

SUMMARY OF THE INVENTION

It is therefore one objective of the present invention to provide a method for controlling a memory device asynchronously with respect to system clock, and a related memory device and memory system to solve the above problems.

It is therefore another objective of the present invention to provide a transmission interface protocol of an asynchronous memory to greatly simplify the complexity of a memory system.

According to an embodiment of the present invention, an exemplary control method of a memory device is disclosed. The control method of the memory device comprises the following steps: performing a data access operation on the memory device asynchronously with respect to a system clock according to address information and an access signal; when the access signal indicates a read operation, generating a data tracking signal according to a memory internal read time which is an elapsed time for data to be read to be read out from the memory device; and outputting the data tracking signal along with the data to be read to a memory control unit external to the memory device such that the outputted data tracking signal is used as a reference signal for the memory control unit to capture the data to be read.

In one implementation, when data to be transmitted are transmitted between the memory control unit and the memory device through a data transmission path, one of the memory control unit and the memory device generates a corresponding data tracking signal so that the other of the memory control unit and the memory device can capture the data to be transmitted according to the corresponding data tracking signal.

According to another embodiment of the present invention, an exemplary memory device is disclosed. The exemplary memory device comprises a memory cell array and a control circuit. The control circuit is coupled between the memory cell array and a memory control unit external to the memory device. The control circuit is arranged for performing a data access operation on the memory device asynchronously with respect to a system clock according to address information and an access signal. When the access signal indicates a read operation, the control circuit further generates a data tracking signal according to a memory internal read time which is an elapsed time for data to be read to be read out from the memory cell array, and outputs the data tracking signal along with the data to be read to the memory control unit such that the outputted data tracking signal is used as a reference signal for the memory control unit to capture the data to be read.

In one implementation, the control circuit outputs the data tracking signal and the data to be read simultaneously. In another implementation, the memory control unit captures the data to be read according to the reference signal.

According to another embodiment of the present invention, an exemplary memory system is disclosed. The exemplary memory system comprises a memory control unit and a memory die. The memory control unit is externally coupled to the memory die, and is arranged for generating address information and an access signal. The memory die performs a data access operation asynchronously with respect to a system clock according to the address information and the access signal. When the access signal indicates a read operation, the memory die further generates a data tracking signal according to a memory internal read time which is an elapsed time for data to be read to be read out from the memory die, and outputs the data tracking signal along with the data to be read to the memory control unit such that the outputted data tracking signal is used as a reference signal for the memory control unit to capture the data to be read.

In one implementation, when the memory die is accessed, one of the memory control unit and the memory device generates a corresponding data tracking signal, and the other of the memory control unit and the memory device uses the corresponding data tracking signal as a capture signal for accessing data.

The proposed memory system, memory device and/or control method of a memory device can define an asynchronous memory interface, wherein the asynchronous memory interface can realize reliable high speed data read/write transmission according to a tracking signal used for accessing data. Under the proposed asynchronous transmission interface protocol, peripheral circuitry of a memory die may have no first in first out (FIFO) circuit and phase lock loop (PLL) circuit, while a serializer may be used to transmit multiple prefetched data elements to an interface external to the memory die in order to meet the high memory bandwidth requirement. Additionally, the proposed memory architecture can increase the utility of a memory die, simplify control circuitry, and realize reliable high speed data access.

These and other objectives of the present invention will no doubt become obvious to those of ordinary skill in the art after reading the following detailed description of the preferred embodiment that is illustrated in the various figures and drawings.

DETAILED DESCRIPTION

A memory die (or a memory device) may include a memory cell array and peripheral circuitry. The proposed memory die (or memory device) may perform data access asynchronously with respect to a system clock, thus omitting a part of the peripheral circuitry, such as a phase-locked loop (PLL) or a delay-locked loop (DLL), while another part of the peripheral circuitry may be replaced with a memory control unit externally coupled to the proposed memory die. Thus, the proposed memory architecture may increase the utility of a memory die, simplify the complexity of a memory system, and realize reliable high speed data transmission.

Figure 1:
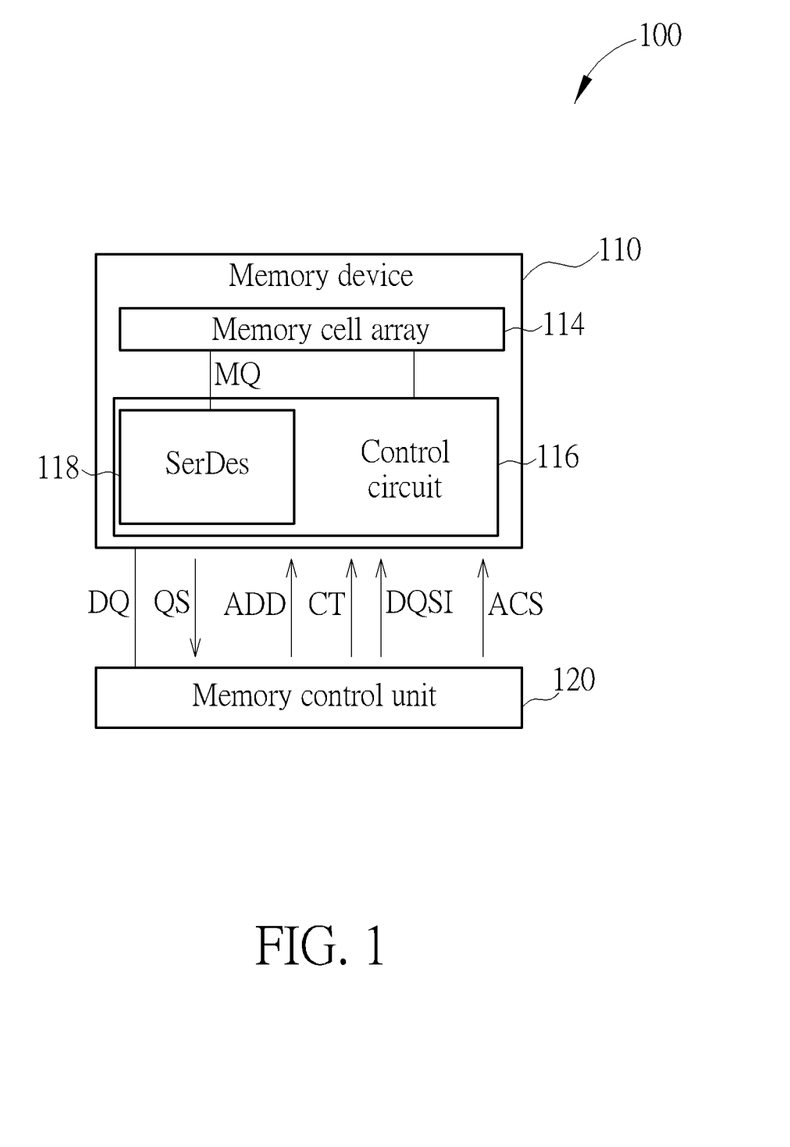
FIG. 1 is a block diagram illustrating an exemplary memory system according to an embodiment of the present invention.

FIG. 1 is a block diagram illustrating an exemplary memory system according to an embodiment of the present invention. The memory system 100 may include, but is not limited to, a memory device 110 (or a memory die) and a memory control unit 120. The memory control unit 120 is externally coupled to the memory device 110, and may generate an access signal CT and address information ADD, thereby issuing an access command to the memory device 110 and performing an addressing operation and a data access operation. In this embodiment, when data transmit between the memory device 110 and the memory control unit 120, one of the memory device 110 and the memory control unit 120 may generate a tracking signal for tracking the transmitted data, wherein the other of the memory device 110 and the memory control unit 120 may capture the transmitted data according to the tracking signal. For example, in a case where the memory system 100 operates in a data read mode, the memory device 110 may perform an data access operation and an addressing operation asynchronously with respect to a system clock according to the access command (e.g. a read command) indicated by the access signal CT and an addressing signal (used for addressing a memory location indicated by the address information ADD). Additionally, the memory device 110 may generate a data tracking signal QS according to a memory internal read time, which is an elapsed time for data to be read (stored in the memory device 110) to be read out from the memory device 110, and output the data tracking signal QS along with the data to be read to the memory control unit 120 such that the outputted data tracking signal QS may be used as a reference signal for the memory control unit 120 to capture the data to be read. In one implementation, the memory device 110 may further drive a data serialization circuit before outputting the data tracking signal QS to the memory control unit 120, thus simultaneously/concurrently outputting the data tracking signal QS and the serialized data to be read.

It should be noted that, as the memory device 110 is controlled by the memory control unit 120 external thereto, a part of memory peripheral circuits may be omitted, thus increasing storage capacity (and/or cell utility) of a memory die. Additionally, as the data to be read may be transmitted according to the data tracking signal QS, memory peripheral circuits of the memory device 110 may not include a FIFO circuit and/or a PLL. In other words, a quite simplified asynchronous memory interface protocol may be provided between the memory device 110 and the memory control unit 120.

In practice, the memory device 110 may include a memory cell array 114 and a control circuit 116. The memory cell array 114 may be used for storing data. The control circuit 116 is coupled to the memory cell array 114 and a data transmission path DQ externally coupled to the memory device 110, and may be arranged for performing a data access operation on the memory cell array 114 asynchronously with respect to the system clock according to the address information ADD and an access command (e.g. a read/write command) indicated by the access signal CT. When the access command is a read command (i.e. the access signal CT indicates a read operation), the control circuit 116 may generate the data tracking signal QS according to a memory internal read time, which is an elapsed time for data to be read (data stored in a memory location indicated by the address information ADD) to be read out from the memory cell array 114, such as an address access time (tAA). Additionally, the control circuit 116 may output the data tracking signal QS along with the data to be read to the memory control unit 120 (through the data transmission path DQ) such that the outputted data tracking signal QS may be used as the reference signal for the memory control unit 120 to capture the data to be read.

Figure 2:
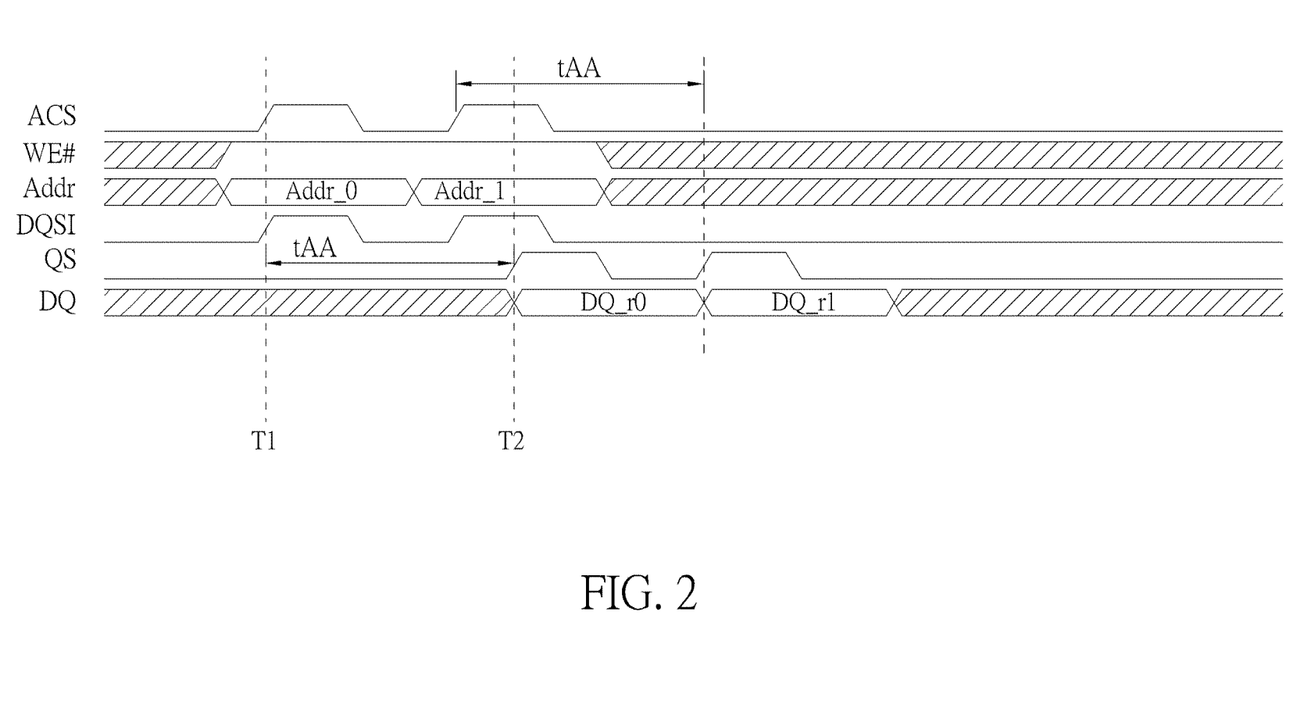
FIG. 2 is a timing diagram of the memory system shown in FIG. 1 in a read mode according to an embodiment of the present invention.
Figure 3:
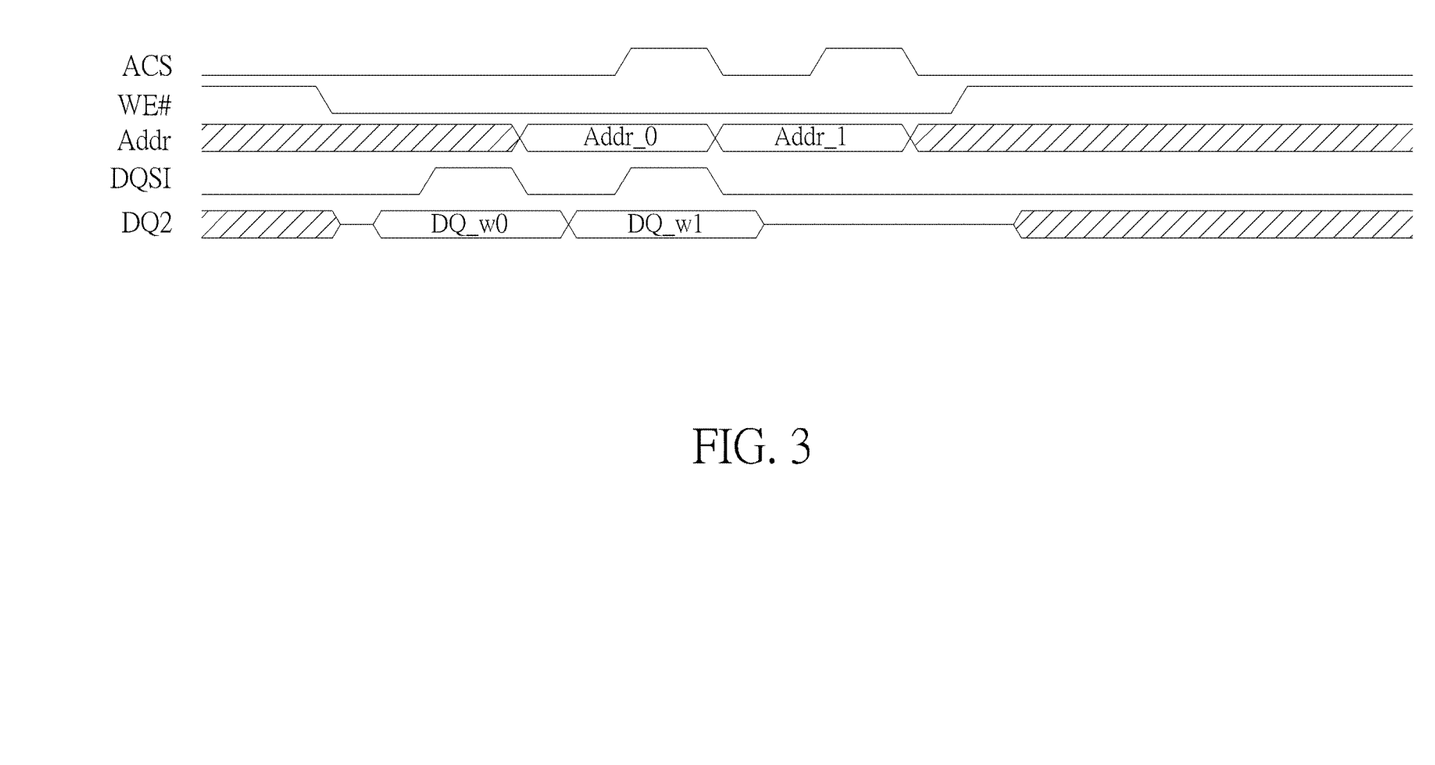
FIG. 3 is a timing diagram of the memory system shown in FIG. 1 in a write mode according to an embodiment of the present invention.

For a better understanding of the present invention, FIG. 2 and FIG. 3 illustrate timing diagrams of the memory system 100 in different operation modes. In the implementations shown in FIG. 2 and FIG. 3, the access signal CT shown in FIG. 1 may include a write enable state WE# (i.e. an access command), which may indicate a read operation or a write operation. The address information ADD may indicate an address Addr of data to be accessed. Further, the control circuit 116 shown in FIG. 1 may capture the access signal CT and the address information ADD according to an auxiliary signal ACS provided by the memory control unit 120 to thereby perform the data access operation. It should be noted that the access signal CT may further include other control state(s). For example, the access signal CT may further include a refresh state.

Please refer to FIG. 2 in conjunction with FIG. 1. FIG. 2 is a timing diagram of the memory system 100 shown in FIG. 1 in a read mode according to an embodiment of the present invention. As shown in FIG. 2, at a point in time T1, the control circuit 116 may receive the auxiliary signal ACS to access data stored at an address Addr_0. Additionally, a reference starting point of the data tracking signal QS (a point in time at which the generation of the data tracking signal QS is triggered) is a point in time at which the control circuit 116 begins to performs the data access operation after receiving the address information ADD and the access signal CT (i.e. the point in time T1). It should be noted that, in order to enable the data tracking signal QS to toggle at adequate points in time for serialized data access, the memory control unit 120 may further generate a start signal DQSI, wherein the control circuit 116 may receive the start signal DQSI when the data access operation begins, and determine the reference starting point of the data tracking signal QS according to the start signal DQSI. In other words, the control circuit 116 may receive the access signal CT, the address information ADD and the start signal DQSI concurrently, wherein a transition of the auxiliary signal ACS may be aligned with a transition of the start signal DQSI. In this implementation, a rising edge of the auxiliary signal ACS is aligned with a rising edge of the start signal DQSI. After a memory internal read time (the address access time tAA) has elapsed (at a point in time T2), the control circuit 116 may generate the data tracking signal QS. In an alternative design, the data tracking signal QS may be implemented by a replica signal of the start signal DQSI, which is delayed by the memory internal read time relative to the start signal DQSI.

Hence, the control circuit 116 may read out the read data DQ_r0 corresponding to the address information ADD (i.e. the address Addr_0) from the memory device 110 (or the memory cell array 114) according to the data tracking signal QS. In this implementation, the control circuit 116 may output the data tracking signal QS to the data transmission path DQ, thereby making the data tracking signal QS accompany the read data DQ_r0, and outputting the data tracking signal QS and the read data DQ_r0 to the data transmission path DQ simultaneously. The memory control unit 120 may capture the read data DQ_r0 according to the data tracking signal QS. Next, the control circuit 116 may output next data (read data DQ_r1 stored at an address Addr_1) from the memory device 110 according to the data tracking signal QS.

Please note that the above implementation of the data tracking signal QS is for illustrative purposes only, and is not meant to be a limitation of the present invention. In an alternative design, the control circuit 116 may directly use a capture signal of the access signal CT and the address information ADD (the auxiliary signal ACS) as a start signal of the data tracking signal QS. In other words, the start signal DQSI may be optional. In another alternative design, the data tracking signal QS may be implemented by a replica signal of the auxiliary signal ACS, which is delayed by the memory internal read time (e.g. the address access time tAA) relative to the auxiliary signal ACS. In brief, as long as the data tracking signal QS is toggled after the memory internal read time has elapsed from a reference starting point of the data tracking signal QS, other variations and modifications fall within the spirit and scope of the present invention.

Please refer to FIG. 3 in conjunction with FIG. 1. FIG. 3 is a timing diagram of the memory system 100 shown in FIG. 1 in a write mode according to an embodiment of the present invention. In this implementation, the memory control unit 120 may generate the start signal DQSI according to a predetermined write speed, and the control circuit 116 may store data to be accessed (write data DQ_w0 and DQ_w1) into the memory cell array 114 (i.e. the addresses Addr_0 and Addr_1) according to the start signal DQSI. It should be noted that, as the start signal DQSI accompanies the data to be accessed and is outputted to the memory device 110 through the data transmission path DQ, and the memory device 110 writes the data to be accessed according to the start signal DQSI, the start signal DQSI in the write mode may be used as a data tracking signal (a tracking signal for tracking transmitted data) between the memory control unit 120 and the memory device 110. As a person skilled in the art should understand the write operation shown in FIG. 3, further description is omitted here for brevity.

Figure 4:
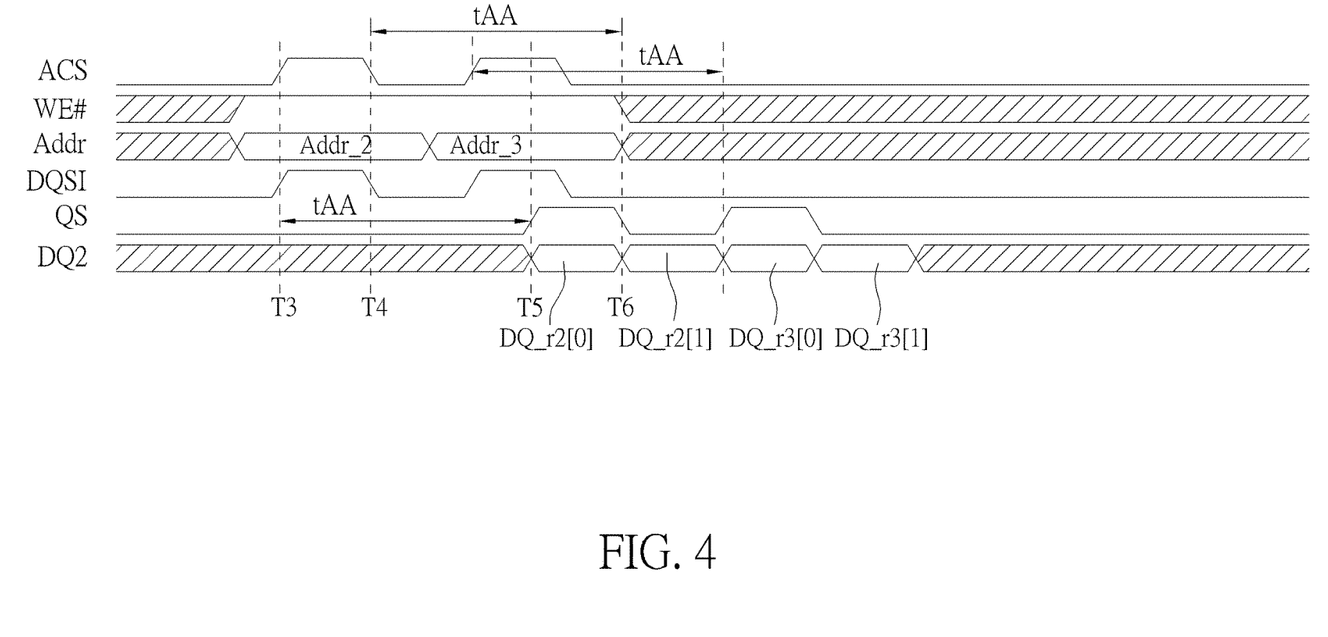
FIG. 4 is a timing diagram of the memory system shown in FIG. 1 in a read mode according to another embodiment of the present invention.

The proposed memory architecture/interface protocol may be employed in high speed data transmission. Please refer to FIG. 4 in conjunction with FIG. 1. FIG. 4 is a timing diagram of the memory system 100 shown in FIG. 1 in a read mode according to another embodiment of the present invention. In this implementation, the memory system 100 may operate in a data prefetch mode (e.g. $2n$ prefetch). The memory device 110 may employ data prefetching to increase the memory bandwidth, and the data bus width of the data transmission path MQ (coupled between the memory cell array 114 and the control circuit 116) may be twice the data bus width of the data transmission path DQ (coupled between the memory device 110 and the memory control unit 120). Hence, the main difference between the timing diagram shown in FIG. 4 and the timing diagram shown in FIG. 2 is that the memory device 110 outputs a data element each time a transition of the data tracking signal QS occurs.

As shown in FIG. 4, as the data to be read stored at the address Addr_2/Addy_3 may include a plurality of data elements, the read operation indicated by the access signal CT may be a continuous data read operation, wherein the aforementioned memory internal read time includes a plurality of sub-read times which are elapsed times for the data elements to be read out from the memory cell array 114, respectively. For example, the data to be read stored at the address Addr_2 may include a plurality of data elements (data elements DQ_r2 [0] and DQ_r2[1]). The control circuit 116 may receive the start signal DQSI when the data access operation begins (a point in time T3), and generate the data tracking signal QS according to the sub-read times (the sub-read time tAA between the points in time T3 and T5, and the sub-read time tAA between the points in time T4 and T6), wherein the reference starting point of the data tracking signal QS may be determined according to the start signal DQSI.

By way of example but not limitation, the control circuit 116 shown in FIG. 1 may include a serializer/deserializer (SerDes) 118 to serialize/deserialize the data to be accessed, thereby increasing the data rate/bandwidth of the memory device 110. In one implementation, the SerDes 118 may serialize the data to be read (the data elements stored at the addresses Addr_2 and Addr_3), and output the data tracking signal QS along with the serialized data to be read (the data elements DQ_r2 [0], DQ_r2 [1], DQ_r3 [0] and DQ_r3 [1]) to the memory control unit 120 through the data transmission path DQ.

It should be noted that the control circuit 116 may directly refer to transition(s) of the auxiliary signal ACS to toggle the data tracking signal QS, and accordingly output the serialized data to be read (the data elements DQ_r2 [0], DQ_r2 [1], DQ_r3 [0] and DQ_r3 [1]). Additionally, in an alternative design, the control circuit 116 may employ a data access scheme different from a serialization/deserialization scheme in order to access multiple data elements by performing a single addressing operation. As a person skilled in the art should understand the read operation shown in FIG. 4 after reading the above paragraphs directed to FIGS. 1-3, further description is omitted here for brevity.

Figure 5:
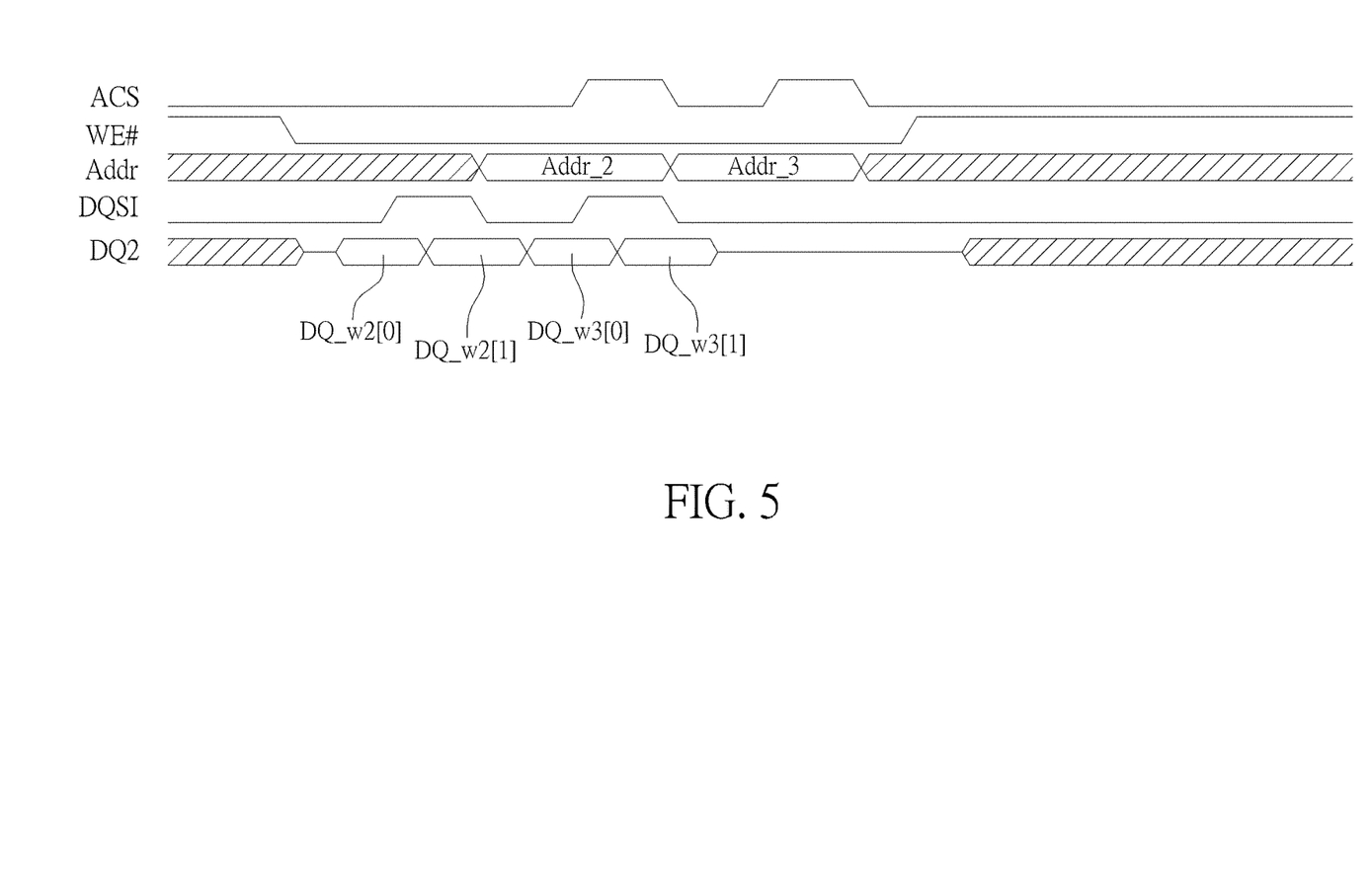
FIG. 5 is a timing diagram of the memory system shown in FIG. 1 in a write mode according to another embodiment of the present invention.

Please refer to FIG. 5 in conjunction with FIG. 1. FIG. 5 is a timing diagram of the memory system 100 shown in FIG. 1 in a write mode according to another embodiment of the present invention. Similar to the implementation shown in FIG. 4, the memory device 110 may include the SerDes 118 to increase the data rate/bandwidth of the memory device 110, wherein the data bus width of the data transmission path MQ may be twice the data bus width of the data transmission path DQ. In this implementation, the memory control unit 120 may generate the start signal DQSI according to a predetermined write speed, and the control circuit 116 may store data to be accessed (write data DQ_w2 [0], DQ_w2 [1], DQ_w3 [0] and DQ_w3 [1]) into the memory cell array 114 (i.e. the addresses Addr_2 and Addr_3) according to the start signal DQSI, wherein the memory control unit 120 writes a data element each time a transition (i.e. a rising edge or a falling edge) of the data tracking signal QS occurs. As a person skilled in the art should understand the write operation shown in FIG. 5 after reading the above paragraphs directed to FIGS. 1-4, further description is omitted here for brevity.

It should be noted that the proposed memory system/device is not limited to operating in a no prefetch mode or a 2n prefetch mode. The proposed asynchronous memory interface may be employed in a memory architecture operating in other prefetch modes so as to further increase the data bandwidth. As long as prefetched data elements of a memory device may be driven by a data tracking signal asynchronous with a system clock and may be outputted to an interface external to the memory device in a serialized manner, such variations and modifications fall within the spirit and scope of the present invention.

Additionally, the above implementation utilizing an auxiliary signal to capture address information and an access signal is for illustrative purposes only, and is not meant to be a limitation of the present invention. In one implementation, the control circuit 116 shown in FIG. 1 may receive at least one (one or more) auxiliary signal, and accordingly capture the address information ADD and the access signal CT. In a case where the address information ADD includes a plurality of information segments, the control circuit 116 may capture the information segments at different points in time according to the at least one auxiliary signal. By way of example but not limitation, the address information ADD may include N information segments (N is an integer greater than one). Hence, the address Addr0 shown in FIG. 2 may be captured in N parts. In practice, the control circuit 116 may receive N auxiliary signals, thereby capturing a first part of bits of the address Addr_0 at a first point in time according to a first auxiliary signal of the N auxiliary signals, capturing a second part of bits of the address Addr_0 at a second point in time according to a second auxiliary signal of the N auxiliary signals, and so on. It should be noted that if the address information ADD is captured in two steps (i.e. N equals two), the control circuit 116 may capture the address information ADD according to a single auxiliary signal. For example, a first information segment of the address information ADD may be captured at a rising edge of the single auxiliary signal, and a second information segment of the address information ADD may be captured at a falling edge of the single auxiliary signal.

Ina case where the control circuit 116 captures the information segments of the address information ADD at different points in time according to the at least one auxiliary signal, the control circuit 116 may further determine the reference starting point of the data tracking signal QS according to the at least one auxiliary signal. When the at least one auxiliary signal includes a plurality of auxiliary signals, the reference starting point of the data tracking signal QS may be a point in time at which the control circuit 116 begins to perform the data access operation after completing receiving the information segments and the access signal CT.

Furthermore, the auxiliary signal used for capturing the address information and the access signal may be implemented by a row address strobe (RAS) signal and/or a column address strobe (CAS) signal, wherein the RAS signal may indicate an activation state of a row (or a wordline), and the CAS signal may indicate an activation state of a column (or a bitline). Hence, the control circuit 116 may perform address a column and a row of the memory cell array 114 at different points in time, and the reference starting point of the data tracking signal QS may be a point in time at which the control circuit 116 addresses and accesses the memory cell array 114.

Based on the above description, the proposed control method of a memory device may be summarized by the following steps: performing a data access operation on the memory device asynchronously with respect to a system clock according to address information and an access signal; when the access signal indicates a read operation, generating a data tracking signal according to a memory internal read time which is an elapsed time for data to be read to be read out from the memory device; and outputting the data tracking signal along with the data to be read to a memory control unit external to the memory device such that the outputted data tracking signal is used as a reference signal for the memory control unit to capture the data to be read. As a person skilled in the art should understand the operation of each step of the aforementioned control method after reading the above paragraphs directed to FIGS. 1-5, further description is omitted here for brevity.

Figure 6:
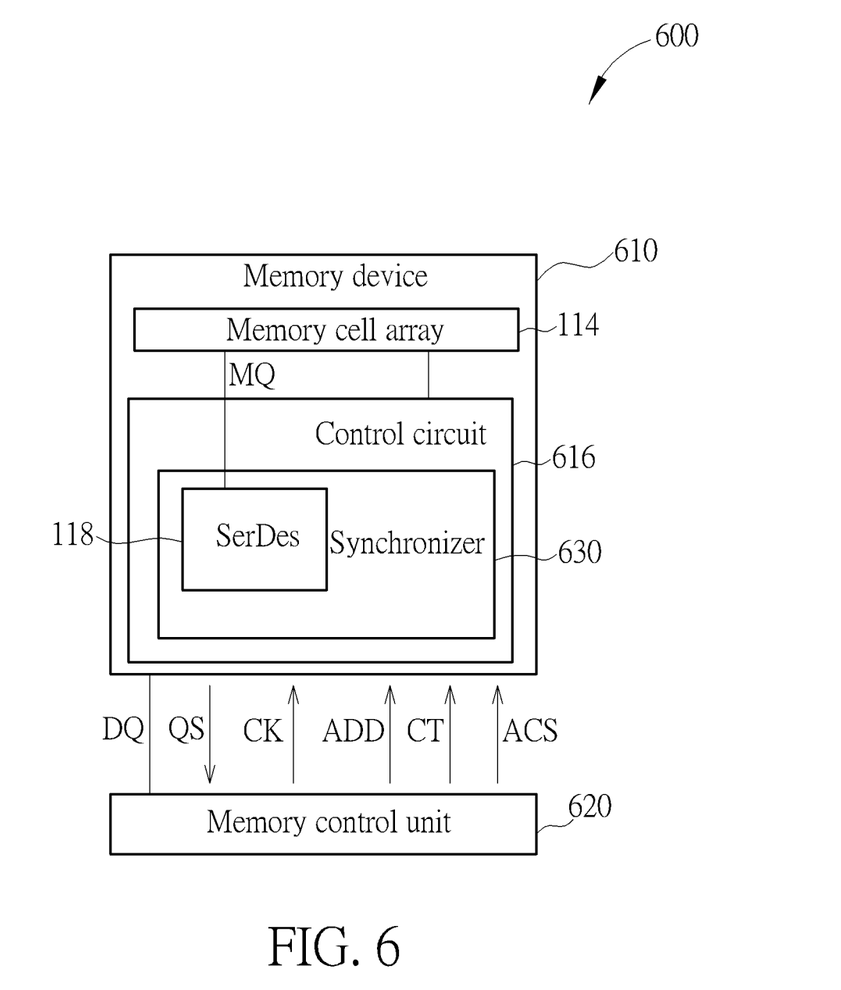
FIG. 6 is a block diagram illustrating an exemplary memory system according to another embodiment of the present invention.

The proposed control method may be employed in a memory device having a synchronous interface. Please refer to FIG. 6, which is a block diagram illustrating an exemplary memory system according to another embodiment of the present invention. The memory architecture shown in FIG. 6 is based on that shown in FIG. 1, wherein the main difference is that a memory system 600 shown in FIG. 6 may include a synchronizer 630 to realize a synchronous interface between a memory device 610 and a memory control unit 620. In this embodiment, the memory device 610 may include the memory cell array 114 shown in FIG. 1 and a control circuit 616. The control circuit 616 may include the synchronizer 630, and the synchronizer 630 may include the SerDes 118 shown in FIG. 1, wherein the synchronizer 630 is coupled to the memory control unit 620, and is arranged for receiving a clock signal CK (or an inverting signal CK# thereof, whose signal waveform is represented by dashed lines) and accordingly performing signal synchronization. Please note that it is possible to dispose the SerDes 118 and the synchronizer 630 separately. By way of example but not limitation, the synchronizer 630 shown in FIG. 6 may be disposed between the control circuit 116 and the memory control unit 120 shown in FIG. 1.

Figure 7:
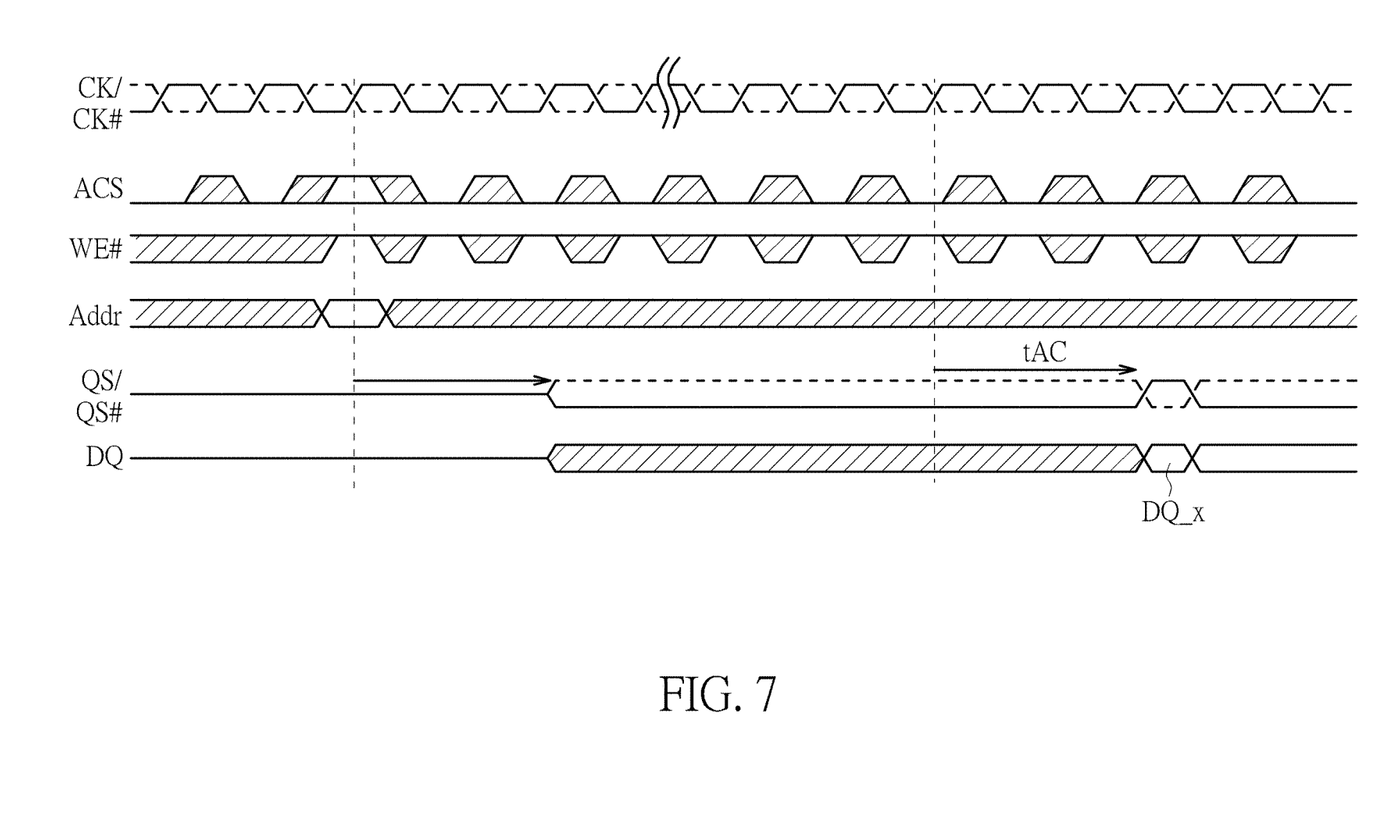
FIG. 7 is a timing diagram of the memory system shown in FIG. 6 in a read mode according to an embodiment of the present invention.

Please refer to FIG. 6 together with FIG. 7. FIG. 7 is a timing diagram of the memory system 600 shown in FIG. 6 in a read mode according to another embodiment of the present invention. As shown in FIG. 7, after a memory internal read time has elapsed since the control circuit 616 receives the access signal CT (including the write enable state WE#), the synchronizer 630 may synchronize the data tracking signal QS and data to be read DQ_x (outputted from the control circuit 616) to the clock signal CK (or the inverting signal CK#), and output the synchronized data tracking signal QS (or an inverting signal QS# thereof, whose signal waveform is represented by dashed lines) and the data to be read DQ_x to the memory control unit 620 synchronously according to a predetermined number of clock cycles of the clock signal CK (or a predetermined latency), wherein "tAC" stands for an address access time from clock. In other words, after a memory internal read time has elapsed since the control circuit 616 receives the access signal CT, the memory control unit 620 may capture the data to be read DQ_x synchronously from the memory device 610 according to a predetermined number of clock cycles of the clock signal CK (or a predetermined latency), and both of the data to be read DQ_x and the data tracking signal QS may be synchronized to the clock signal CK.

In addition to output-side synchronization, it is possible to use the clock signal to realize input-side synchronization of the memory device. Byway of example but not limitation, the synchronizer 630 may receive a clock signal to realize the input-side synchronization. In this embodiment, the synchronizer 630 may synchronize an access command (the write enable state WE#) indicated by the access signal CT to the clock signal, and transmit the synchronized access command to the control circuit 616. Hence, the access command outputted to the memory device 610 may be synchronous with the clock signal.

It should be noted that the above implementation of the synchronous interface between the memory device and the memory control unit is for illustrative purposes only, and is not meant to be a limitation of the present invention. For example, it is possible to dispose the synchronizer 630 shown in FIG. 6 in the control circuit 616 so as to realize the synchronous interface between the memory device and the memory control unit.

Figure 8:
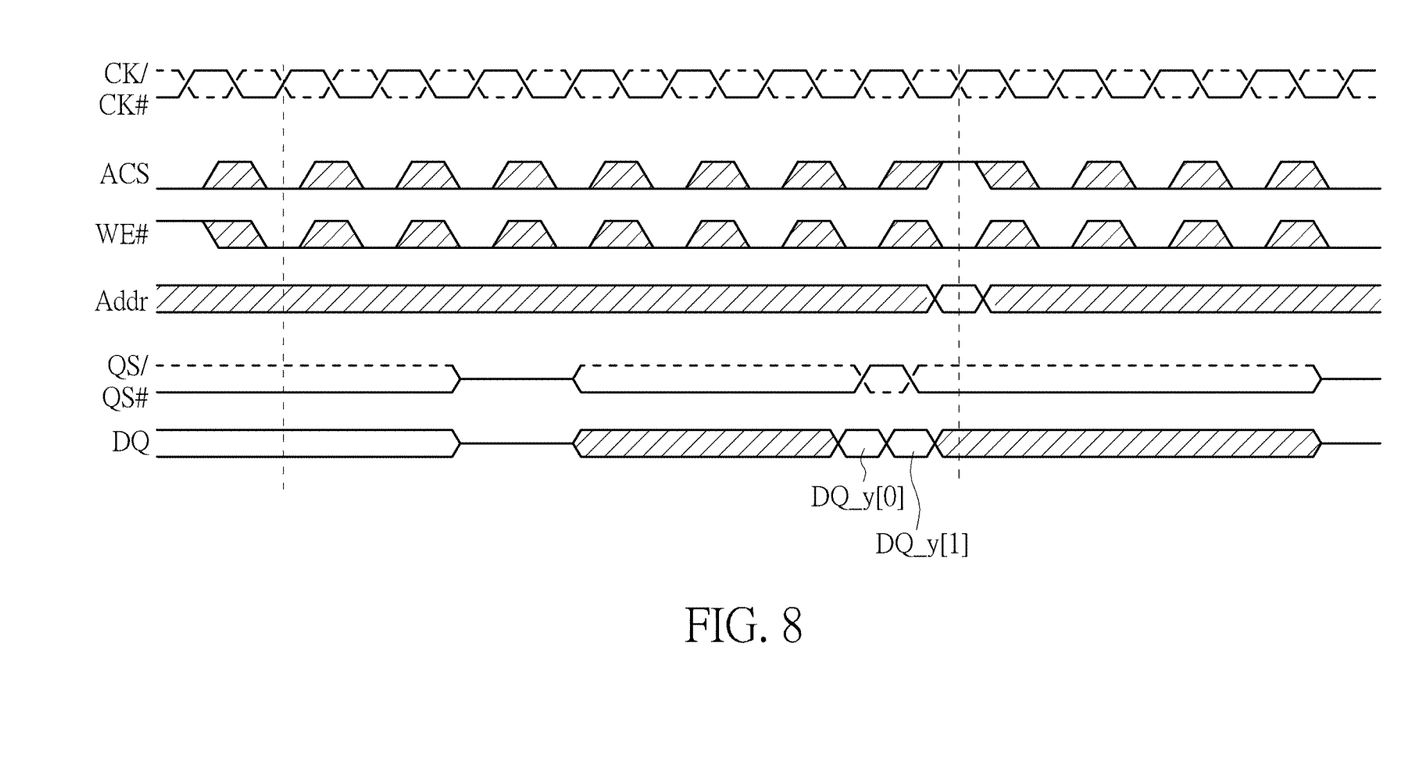
FIG. 8 is a timing diagram of the memory system shown in FIG. 6 in a write mode according to an embodiment of the present invention.

The input-side and output-side synchronization of the memory device may be implemented in a write mode. Please refer to FIG. 6 together with FIG. 8. FIG. 8 is a timing diagram of the memory system 600 shown in FIG. 6 in a write mode according to an embodiment of the present invention. As shown in FIG. 8, the synchronizer 630 may synchronize the write enable state WE# (an access command) to the auxiliary signal ACS (implemented by the clock signal CK), and synchronize transfer of data to be access (data elements DQ_y[0] and DQ_y[1]) and the data tracking signal QS to the clock signal CK. As a person skilled in the art should understand the write operation shown in FIG. 8 after reading the above paragraphs directed to FIGS. 1-7, further description is omitted here for brevity.

To sum up, the proposed memory system, memory device and/or control method of a memory device can define an asynchronous memory interface, wherein the asynchronous memory interface can realize reliable high speed data read/write transmission according to a tracking signal used for accessing data. Additionally, the proposed memory interface may employ data prefetching to increase the memory bandwidth.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A control method of a memory device, comprising:
performing a data access operation on the memory device asynchronously with respect to a system clock according to address information and an access signal generated from a memory control unit external to the memory device;
when the access signal indicates a read operation and the address information indicates a memory location in the memory device, generating a data tracking signal according to a memory internal read time, wherein the memory internal read time is a period of time elapsed between when the memory device receives the access signal and when the memory device outputs data stored in the memory location to the memory control unit; and
outputting the data tracking signal along with the data to the memory control unit external to the memory device, such that the outputted data tracking signal is used as a reference signal for the memory control unit to capture the data.

2. The control method of claim 1, wherein a reference starting point of the data tracking signal is a point in time at which the data access operation performed on the memory device begins after the address information and the access signal are received by the memory device.

3. The control method of claim 1, further comprising:
capturing the address information and the access signal into the memory device according to at least one auxiliary signal.

4. The control method of claim 3, wherein the step of capturing the address information and the access signal into the memory device according to the at least one auxiliary signal comprises:
capturing the address information in a segmented manner according to the at least one auxiliary signal such that a plurality of information segments of the address information are captured into the memory device at different points in time.

5. The control method of claim 4, wherein the at least one auxiliary signal comprises a plurality of auxiliary signals, and the information segments are captured into the memory device according to the auxiliary signals, respectively.

6. The control method of claim 4, wherein a reference starting point of the data tracking signal is a point in time at which the data access operation performed on the memory device begins after the information segments and the access signal are completely received by the memory device.

7. The control method of claim 3, wherein a reference starting point of the data tracking signal is determined according to the at least one auxiliary signal.

8. The control method of claim 3, wherein the at least one auxiliary signal is a clock signal, and the step of capturing the address information and the access signal into the memory device according to the at least one auxiliary signal comprises:
synchronizing an access command indicated by the access signal to the clock signal; and
capturing the access command synchronous with the clock signal into the memory device.

9. The control method of claim 1, further comprising:
after the memory internal read time has elapsed since the memory device receives the access signal, capturing the data synchronously from the memory device according to a predetermined number of clock cycles of a clock signal or a predetermined latency; and
synchronizing the data tracking signal and the captured data to the clock signal.

10. The control method of claim 1, wherein the data comprises a plurality of data elements; the read operation is a continuous data read operation; the memory internal read time comprises a plurality of sub-read times which are elapsed times for the data elements to be read out from the memory device by the memory control unit, respectively; and the control method further comprises:

when the data access operation begins, outputting a start signal to the memory device;

and the step of generating the data tracking signal according to the memory internal read time comprises:

generating the data tracking signal according to the sub-read times;

wherein a reference starting point of the data tracking signal is determined according to the start signal.

11. A memory device, comprising:

a memory cell array; and a control circuit, coupled between the memory cell array and a memory control unit external to the memory device, the control circuit arranged for performing a data access operation on the memory device asynchronously with respect to a system clock according to address information and an access signal generated from the memory control unit, wherein when the access signal indicates a read operation and the address information indicates a memory location in the memory cell array, the control circuit further generates a data tracking signal according to a memory internal read time; the memory internal read time is a period of time elapsed between when the memory device receives the access signal and when the memory device outputs data stored in the memory location to the memory control unit; and the control circuit outputs the data tracking signal along with the data to the memory control unit such that the outputted data tracking signal is used as a reference signal for the memory control unit to capture the data.

12. The memory device of claim 11, wherein a reference starting point of the data tracking signal is a point in time at which the control circuit begins to performs the data access operation after receiving the address information and the access signal.

13. The memory device of claim 11, wherein the control circuit further captures the address information and the access signal according to at least one auxiliary signal.

14. The memory device of claim 13, wherein the address information comprises a plurality of information segments, and the control circuit captures the information segments at different points in time according to the at least one auxiliary signal.

15. The memory device of claim 14, wherein the at least one auxiliary signal comprises a plurality of auxiliary signals, and the control circuit captures the information segments according to the auxiliary signals, respectively.

16. The memory device of claim 14, wherein a reference starting point of the data tracking signal is a point in time at which the control circuit begins to perform the data access operation after completing receiving the information segments and the access signal.

17. The memory device of claim 13, wherein the control circuit further determines a reference starting point of the data tracking signal according to the at least one auxiliary signal.

18. The memory device of claim 13, wherein the at least one auxiliary signal is a clock signal, and the memory device further comprises:

a synchronizer, coupled to the memory control unit, the synchronizer arranged for receiving the clock signal and the access signal, synchronizing an access command indicated by the access signal to the clock signal, and transmitting the access command synchronous with the clock signal to the control circuit.

19. The memory device of claim 11, further comprising:

a synchronizer, coupled to the memory control unit, the synchronizer arranged for receiving a clock signal, wherein after the memory internal read time has elapsed since the control circuit receives the access signal, the synchronizer further synchronizes the data tracking signal and the data outputted from the control circuit to the clock signal, and outputs the synchronized data tracking signal and the synchronized data to the memory control unit according to a predetermined number of clock cycles of the clock signal or a predetermined latency.

20. The memory device of claim 11, wherein the data comprises a plurality of data elements; the read operation is a continuous data read operation; the memory internal read time comprises a plurality of sub-read times which are elapsed times for the data elements to be read out from the memory cell array by the memory control unit, respectively; and the control circuit further receives a start signal when the data access operation begins, generates the data tracking signal according to the sub-read times, and determines a reference starting point of the data tracking signal according to the start signal.

21. The memory device of claim 20, wherein the control circuit comprises:

a serializer/deserializer, arranged for serializing the data, and outputting the data tracking signal along with the serialized data to the memory control unit.

22. The memory device of claim 11, wherein the memory device is a memory die.

23. A memory system, comprising:

a memory control unit, arranged for generating address information and an access signal; and a memory die, wherein the memory control unit is externally coupled to the memory die, and the memory die performs a data access operation asynchronously with respect to a system clock according to the address information and the access signal;

wherein when the access signal indicates a read operation and the address information indicates a memory location in the memory die, the memory die further generates a data tracking signal according to a memory internal read time; the memory internal read time is a period of time elapsed between when the memory die receives the access signal and when the memory die outputs data stored in the memory location to the memory control unit; and the memory die outputs the data tracking signal along with the data to the memory control unit such that the outputted data tracking signal is used as a reference signal for the memory control unit to capture the data.

* * * * *